United States Patent
Zhang et al.

(10) Patent No.: US 10,983,150 B2
(45) Date of Patent: Apr. 20, 2021

(54) SYSTEMS AND METHODS FOR DETECTING AND EVALUATING OSCILLATIONS IN AN ELECTRICAL POWER GRID

(71) Applicant: General Electric Technology GmbH, Baden (CH)

(72) Inventors: Zhiying Zhang, Markham (CA); Ilia Voloh, Markham (CA); Mark Gerard Adamiak, King of Prussia, PA (US)

(73) Assignee: General Electric Technology GmbH, Baden (CH)

( * ) Notice: Subject to any disclaimer, the term of this patent is extended or adjusted under 35 U.S.C. 154(b) by 319 days.

(21) Appl. No.: 15/687,847

(22) Filed: Aug. 28, 2017

(65) Prior Publication Data
US 2019/0064232 A1 Feb. 28, 2019

(51) Int. Cl.
*G01R 19/25* (2006.01)
*G01R 19/257* (2006.01)
*H02J 13/00* (2006.01)
*H02J 3/24* (2006.01)

(52) U.S. Cl.
CPC ..... *G01R 19/2513* (2013.01); *G01R 19/2506* (2013.01); *G01R 19/257* (2013.01); *H02J 3/24* (2013.01); *H02J 13/0006* (2013.01)

(58) Field of Classification Search
CPC .............. G05F 3/04; H01F 27/34; H02H 3/00
See application file for complete search history.

(56) References Cited

U.S. PATENT DOCUMENTS

| 4,384,246 A | 5/1983 | Larsen et al. |
| 5,179,489 A * | 1/1993 | Oliver ................... G05F 3/04 361/111 |
| 6,456,947 B1 | 9/2002 | Adamiak et al. |
| 9,806,690 B1 * | 10/2017 | Gong .................. H02H 3/48 |
| 2005/0141682 A1 * | 6/2005 | Wells .................. H02J 3/00 379/90.01 |

(Continued)

FOREIGN PATENT DOCUMENTS

| CN | 101237148 A1 | 8/2008 |
| DE | 3742555 A1 | 7/1988 |

(Continued)

OTHER PUBLICATIONS

ABB Review Apr. 2015 (Year: 2015).*

(Continued)

*Primary Examiner* — Kyle R Quigley
(74) *Attorney, Agent, or Firm* — Eversheds Sutherland (US) LLP

(57) ABSTRACT

Various embodiments described in this disclosure pertain to methods and systems for detecting and evaluating oscillations in an electrical power grid. The oscillations can include one or more oscillatory conditions, which can occur in one or more of five predefined frequency bands. Each of the five predefined frequency bands is categorized at least in part, by oscillations that are originated by uniquely different sources. In one embodiment, an oscillation detector can be used to detect the oscillatory condition and determine a magnitude characteristic, a phase characteristic, and/or a damping characteristic of at least one oscillation frequency that contributes to the oscillatory condition.

15 Claims, 3 Drawing Sheets

(56) References Cited

U.S. PATENT DOCUMENTS

2014/0070617 A1\*   3/2014   Detmers ................... H02J 3/32
                                                   307/64
2018/0041041 A1\*   2/2018   Blackwelder ............. H02J 3/40

FOREIGN PATENT DOCUMENTS

| EP | 0671067 A | 9/1995 |
| WO | 1996/035250 A | 11/1996 |
| WO | 2001/093405 A | 12/2001 |
| WO | 200193401 A1 | 12/2001 |
| WO | 2005/088802 A1 | 9/2005 |
| WO | 2005088802 A1 | 9/2005 |
| WO | 2016158198 A1 | 10/2016 |

OTHER PUBLICATIONS

Prasertwong et al., Understanding Low-Frequency Oscillation in Power Systems, IEEE, Jul. 2010 (Year: 2010).\*

Communication Pursuant to Article 94(3) EPC, Application No. 18190469.9-1202, dated Jan. 29, 2020.

International Search Report for PCT/DE2005/000315 dated Jul. 27, 2005.

EP18190469 European Search Report dated Jan. 8, 2019; 135 pages.

\* cited by examiner

SYSTEMS AND METHODS FOR DETECTING AND EVALUATING OSCILLATIONS IN AN ELECTRICAL POWER GRID

FIELD OF THE DISCLOSURE

This disclosure generally relates to oscillation detection, and more particularly, to systems and methods for detecting and evaluating oscillations in an electrical power grid.

BACKGROUND OF THE DISCLOSURE

An electrical power grid typically includes various components such as transmission lines, pylons, electric power generators, transformers, and circuit breakers, that are installed over a large geographical area. At the customer end of the electrical power grid, a wide variety of elements such as lighting elements (for example, bulbs and light fixtures), heating/cooling elements (for example, heaters and air conditioners), and industrial equipment (for example, electric motors and electrical machinery) operate as a diverse, distributed load that draws power through the electrical power grid. The various components that constitute the electrical power grid and the various components that constitute the load on the electrical power grid are subjected to various electrical, mechanical, electro-mechanical, and environmental forces that can lead to undesirable oscillatory conditions.

For example, one type of oscillation can be created in a power transmission line due to swinging of a rotor in an electrical power generator. Another type of oscillation can be created in a power transmission line due to switching transients or other electrical anomalies generated, for example, by a switching power supply having a switching-mode of operation. Yet another type of oscillation can be created in a power transmission line due to the nature of the impedance (distributed inductance and distributed capacitance) presented by the power transmission line to an electrical power generator, for example.

Some of these undesirable oscillations are automatically damped and do not have a significant impact upon operations. However, some other types of oscillations such as those caused by very long power transmission lines, devices containing power electronics, and synchronous generators interacting with each other, can lead to operational instabilities and damage to various components of the electrical power grid. Such undesirable oscillations can have adverse effects upon the electrical power grid and components coupled to the electrical power grid.

BRIEF DESCRIPTION OF THE DISCLOSURE

Embodiments of the disclosure are directed generally to systems and methods for detecting and evaluating oscillations in an electrical power grid.

According to one exemplary embodiment of the disclosure, a system can include an oscillation detector. The oscillation detector is configured to receive digital data indicative of amplitude fluctuations in electricity transmitted through an electrical power grid; process the digital data for detecting an oscillatory condition in at least one of five predefined frequency bands; and upon detecting the oscillatory condition, determine at least one of a magnitude characteristic, a phase characteristic, or a damping characteristic of at least one oscillation frequency that contributes to the oscillatory condition.

According to another exemplary embodiment of the disclosure, a method can include receiving digital data indicative of amplitude fluctuations in electricity transmitted through an electrical power grid; processing the digital data for detecting an oscillatory condition in the electrical power grid; and upon detecting the oscillatory condition, determining at least one of a magnitude characteristic, a phase characteristic, or a damping characteristic of at least one oscillation frequency that contributes to the oscillatory condition.

According to yet another exemplary embodiment of the disclosure, a method can include obtaining, in real-time, sensor data indicative of amplitude fluctuations in electricity transmitted through an electrical power grid; converting, in real-time, the sensor data into digital data samples; processing the digital data for detecting an oscillatory condition in the electrical power grid; and upon detecting the oscillatory condition, determining at least one of a magnitude characteristic, a phase characteristic, or a damping characteristic of at least one oscillation frequency that contributes to the oscillatory condition.

Other embodiments and aspects of the disclosure will become apparent from the following description taken in conjunction with the following drawings.

BRIEF DESCRIPTION OF THE DRAWINGS

Figure 1:
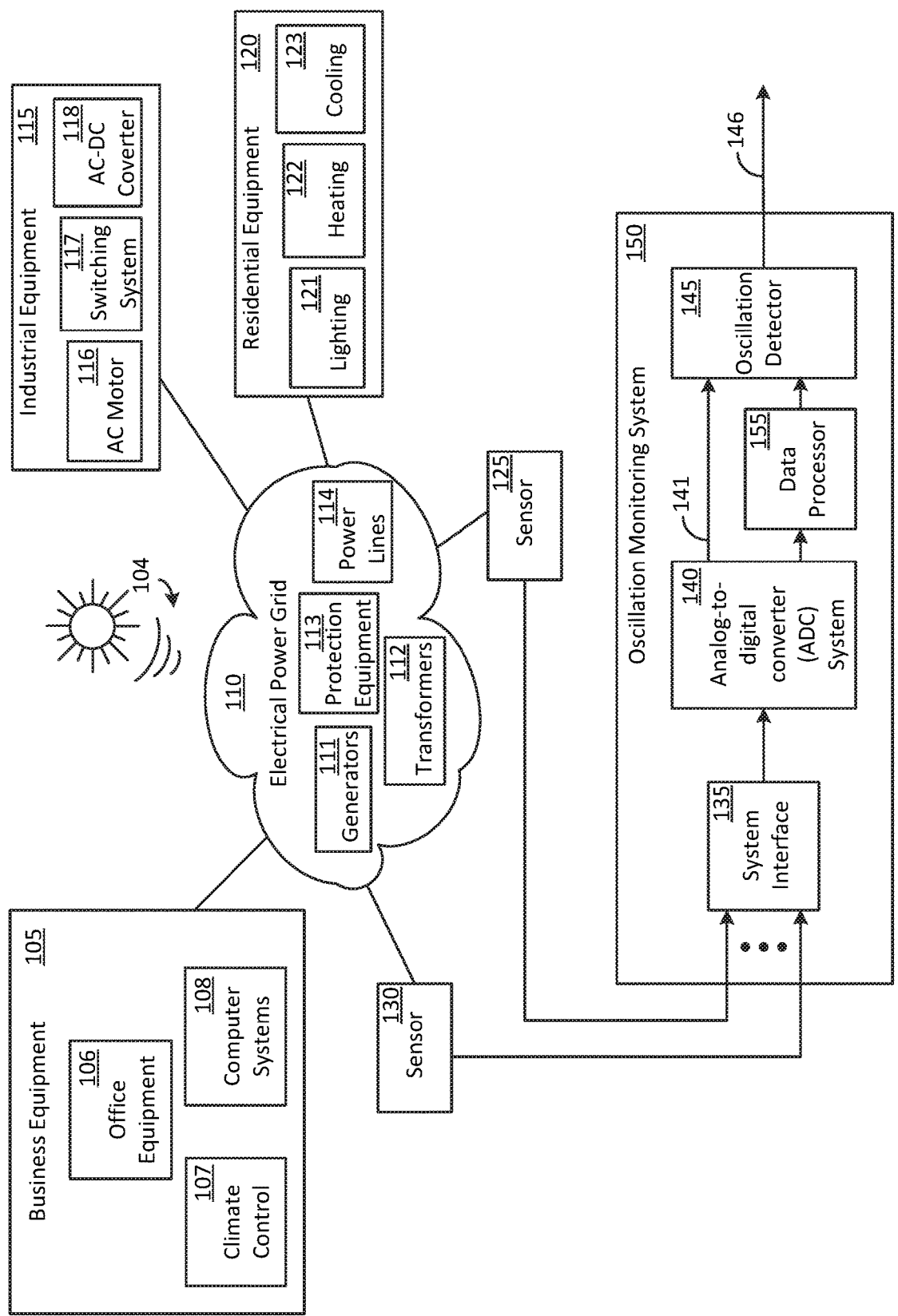

Having thus described the disclosure in general terms, reference will now be made to the accompanying drawings, which are not necessarily drawn to scale, and wherein:

FIG. 1 illustrates an oscillation monitoring system coupled to an electrical power grid in accordance with an exemplary embodiment of the disclosure.

Figure 2:
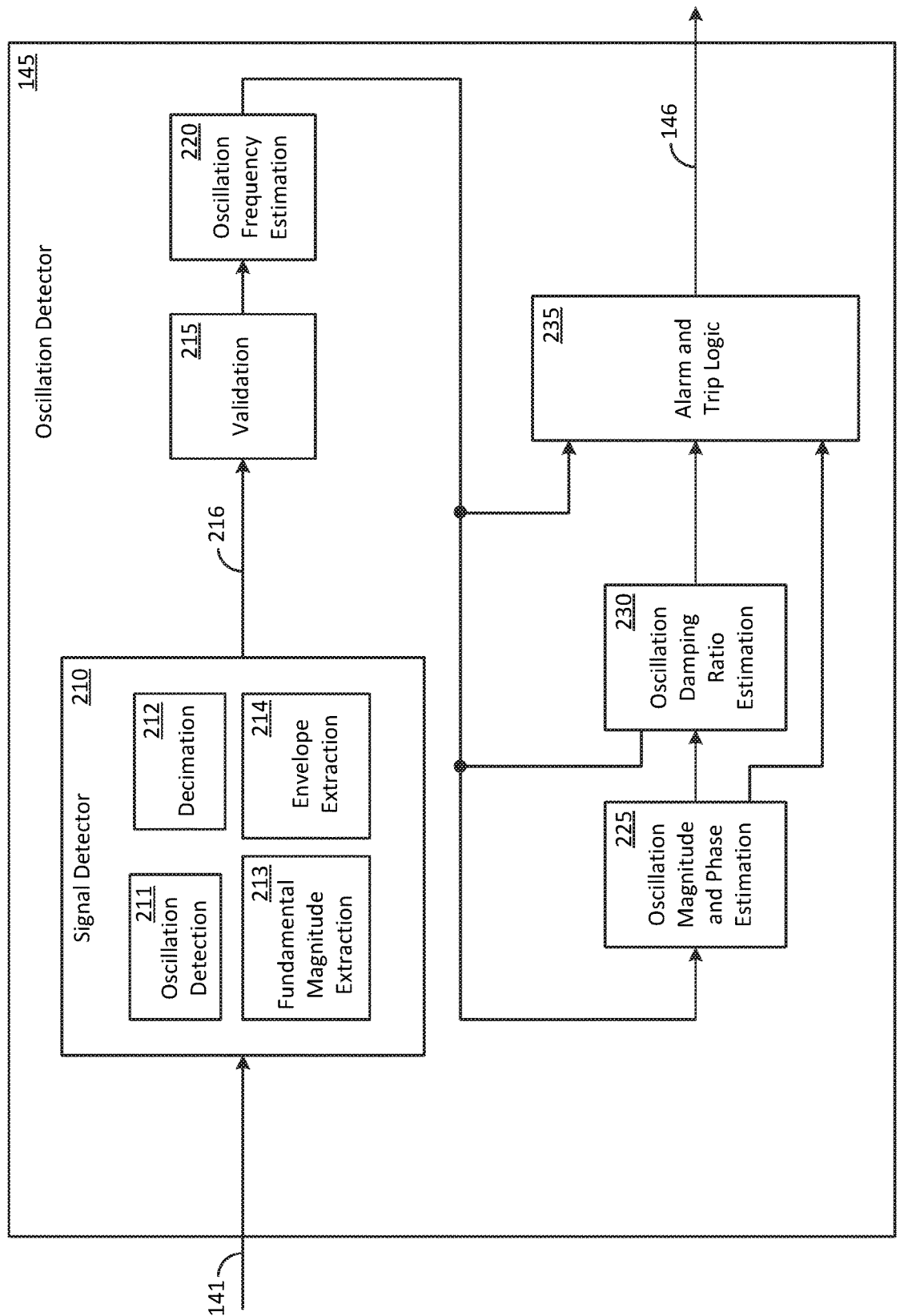

FIG. 2 illustrates some exemplary elements that can be included in the oscillation monitoring system shown in FIG. 1.

Figure 3:
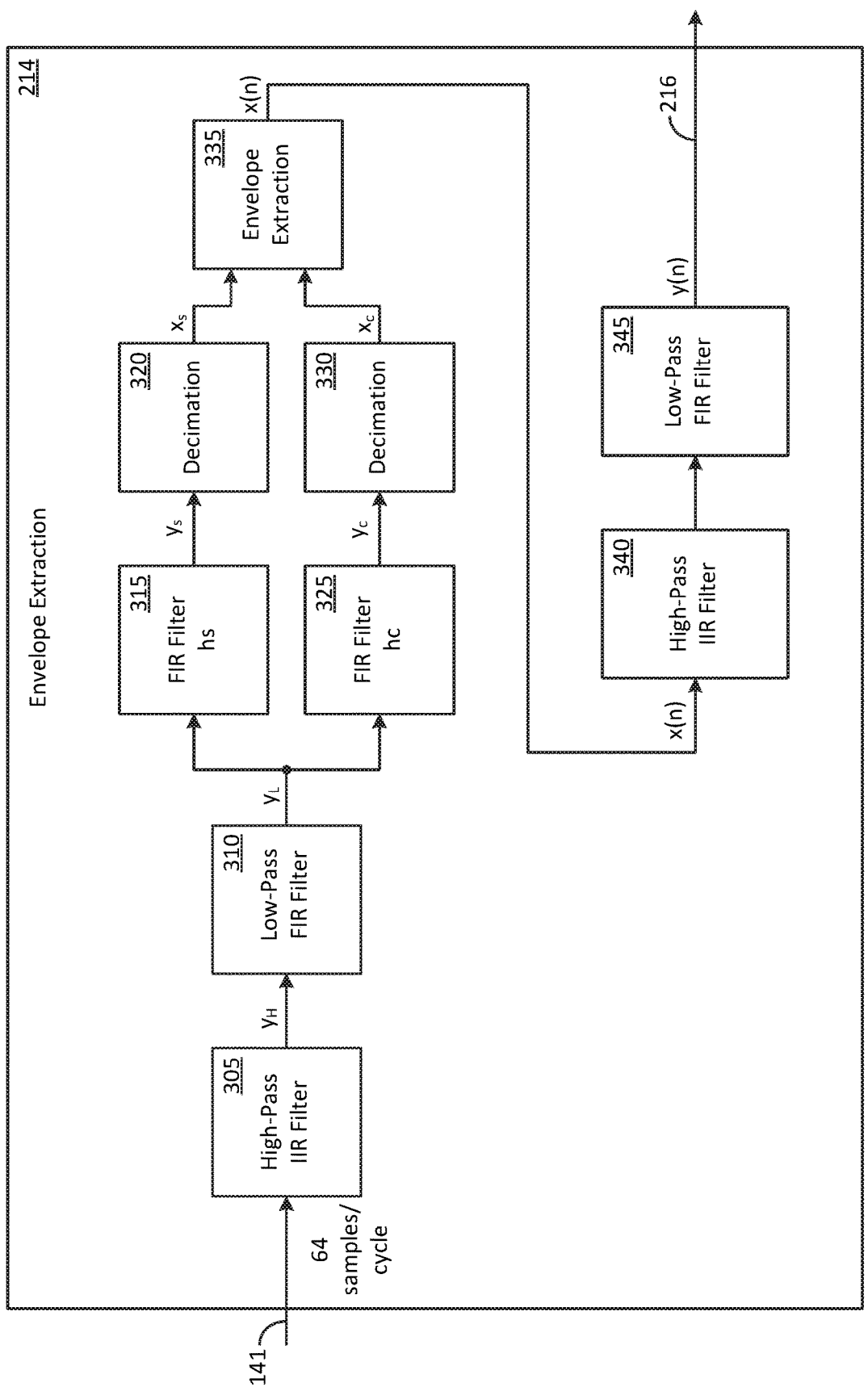

FIG. 3 illustrates some exemplary elements that can be utilized for envelope extraction in a signal detector portion of the oscillation monitoring system shown in FIG. 1.

The disclosure will be described more fully hereinafter with reference to the drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. Furthermore, the word "example" as used herein is intended to be non-exclusionary and non-limiting in nature. More particularly, the word "exemplary" as used herein indicates one among several examples, and it should be understood that no undue emphasis or preference is being directed to the particular example being described.

DETAILED DESCRIPTION

In terms of a general overview, certain embodiments described in this disclosure pertain to an exemplary systems and methods that can be used to detect and evaluate oscillations in an electrical power grid. Such systems and methods can be implemented, for example, by an oscillation monitoring system with an oscillation detector. The oscillations can include, for example, an oscillatory condition that can occur in one or more of five predefined frequency bands.

Each of the five predefined frequency bands is categorized at least in part, by oscillations that are originated by uniquely different sources. For example, an oscillation in the first predefined frequency band can be originated by a governor or an automatic generation control condition in a component that is a part of the electrical power grid; an oscillation in the second predefined frequency band can be originated by an inter-area oscillation; an oscillation in the third predefined frequency band can be a forced oscillation originated by an operational interaction between two or more components coupled to the electrical power grid; an oscillation in the fourth predefined frequency band can be originated by a sub-synchronous resonance condition or a sub-synchronous torsional interaction between two components coupled to the electrical power grid; and an oscillation in the fifth predefined frequency band can be originated by geomagnetically induced currents present in at least one component that is a part of the electrical power grid. When an oscillatory condition is detected, an oscillation detector can determine a magnitude characteristic, a phase characteristic, and/or a damping characteristic of at least one oscillation frequency that contributes to the oscillatory condition.

In general, and in accordance with the various embodiments of the disclosure, the first predefined frequency band can extend from about 0.01 Hz to about 0.1 Hz, the second predefined frequency band can extend from about 0.1 Hz to about 1.0 Hz, the third predefined frequency band can extend from about 1.0 Hz to about 10 Hz, the fourth predefined frequency band can extend from about 10 Hz to about 45 Hz (or 55 Hz depending upon the nominal system frequency of operation), and the fifth predefined frequency band can include a direct current (DC) component. The fifth predefined frequency band can further include electromagnetically induced currents that are originated by sources such as the sun.

FIG. 1 illustrates an oscillation monitoring system 150 coupled to an electrical power grid 110 in accordance with an exemplary embodiment of the disclosure. The electrical power grid 110 can, in certain instances, include a relatively large number of components and systems that are connected to each other so as to enable conveyance of electrical power generated by geographically-dispersed power plants to geographically-dispersed end users, such as industrial consumers, residential consumers, and/or business consumers. A few examples of components and systems that can be a part of the electrical power grid 110 include power generators 111, power transformers 112, protection equipment 113 (relays, circuit breakers, fuses, etc.), and power lines 114. A few examples of components and systems that can be coupled to the electrical power grid 110 can include business equipment 105 used by business consumers (office equipment 106, climate control 107, computer systems 108, etc.), industrial equipment 115 used by industrial consumers (AC motor 116, switching system 117, AC-to-DC converter 118, etc.), and residential equipment 120 used by residential consumers (lighting 121, heating 122, cooling 123, etc.).

The various components that are a part of the electrical power grid 110 and/or are coupled to the electrical power grid 110, can individually or in cooperation with each other create undesirable oscillations that can cause damage if left undetected and unaddressed. An additional source of undesirable oscillations can be attributed to electromagnetic energy 104 radiated by the sun. The electromagnetic energy 104 can facilitate electromagnetically induced currents in the electrical power grid 110.

Detection and addressing of these undesirable oscillations can be carried out by using various sensors that are coupled to the electrical power grid 110 to provide sensor data to the oscillation monitoring system 150. For example, sensor 130 can be coupled to one or more power lines 114 to obtain power line frequency data (power line frequency as well as any oscillation frequencies that may be present in the power lines 114). Sensor 125 can be coupled to one of the generators 111 and/or one of the transformers 112, for example, in order to obtain frequency data pertaining to oscillation frequencies that may be present in the generators 111 and/or the transformers 112. The frequency data collected by the sensors, such as by the sensor 125 and the sensor 130, is coupled into a system interface 135 of the oscillation monitoring system 150.

In one exemplary implementation, the system interface 135 can include one or more frequency filters, such as for example, one or more bandpass filters each having a bandpass characteristic that prevents aliasing of any respective one of the first four predefined frequency bands. A lowpass filter can be used in place of a bandpass filter for the fifth predefined frequency band because the fifth predefined frequency band can include a DC component.

The analog signal that is output by the system interface 135 is coupled into an analog-to-digital converter (ADC) 140 that converts the analog signal into digital data samples. The digital data samples, which indicate amplitude fluctuations in electricity transmitted through the electrical power grid 110, are provided to the oscillation detector 145 at a desired sample rate (such as 3840 samples per second) for detecting and evaluating one or more oscillatory conditions that may be present in the electrical power grid 110. In one exemplary implementation, the digital data samples can be processed by a data processor 155 in order to obtain processed digital data that represents, for example, voltage measurements, current measurements, and/or power measurements. The processed digital data is provided to the oscillation detector 145 for detecting and evaluating one or more oscillatory conditions that may be present in the electrical power grid 110.

In another exemplary implementation, the data processor 155 can be configured to operate as a programmable frequency filter. The programmable frequency filter can be, for example, a finite impulse filter (FIR) providing one of a bandpass characteristic that matches one of the four predefined frequency bands or a lowpass characteristic that matches the fifth predefined frequency band (based on an oscillation frequency of interest). Thus, when the oscillation monitoring system 150 is configured at a first instant in time to detect and evaluate an oscillation frequency in the fourth predefined frequency band, the FIR is configured during the first instant in time to propagate frequencies present in the fourth predefined frequency band, and reconfigured at a later instant in time to propagate frequencies present in the third predefined frequency band in order to allow the oscillation monitoring system 150 to detect and evaluate an oscillation frequency in the third predefined frequency band.

FIG. 2 illustrates some exemplary elements that can be included in the oscillation detector 145. The exemplary elements of the oscillation detector 145 are shown as functional blocks. These functional blocks can be implemented in hardware, software, or a combination of hardware and software. For example, oscillation detection 211 that is a part of an exemplary signal detector 210 can be implemented using logic devices, and each of the decimation 212, fundamental magnitude extraction 213, and envelope extraction 214 blocks, which are also included in the signal detector 210, can be implemented using a digital signal processor (DSP) and/or a processor that executes computer-executable readable instructions.

The exemplary signal detector 210 receives the digital data samples provided by the ADC 140 via the link 141 and executes one or more of the exemplary blocks that include oscillation detection 211, decimation 212, fundamental magnitude extraction 213, and envelope extraction 214. Oscillation detection 211 can include one or more filters to detect an oscillation frequency that contributes to an undesirable oscillatory condition in the electrical power grid 110. Decimation 212 can be used to convert the sample rate of the digital data samples to a different sample rate, such as from 3840 samples per second to 480 samples per second, for example. Fundamental magnitude extraction 213 determines a magnitude characteristic of one or more oscillation frequencies. In one exemplary implementation, the magnitude characteristic is defined on a per unit basis that is calculated using Fourier techniques.

Envelope extraction 214 can be used particularly when operating upon digital data samples having frequency components in the fourth frequency band. Further details pertaining to envelope extraction 214 will be described below using FIG. 3.

The output of the signal detector 210 constitutes digital data samples that have been filtered as well as operated upon in various ways such as the ones described above. The digital data samples, which can belong to any one of the five predefined frequency bands, is validated via validation 215 to verify that the digital data samples belong to a specific frequency band among the five predefined frequency bands. In one exemplary implementation, validation 215 can be carried out by a time domain validation check. Validation 215 can also include other operations such as dead band checking to determine whether consecutive positive AC samples exceed an upper dead band threshold and/or consecutive negative AC samples exceed a lower dead band threshold. The dead band thresholds can include tolerance levels to accommodate steady state conditions in the digital data samples and prevent further processing upon the digital data samples when low magnitude noise is present.

Oscillation frequency estimation 220 can be executed immediately after validation 215, particularly for detecting an inter-area low frequency oscillation. A time-domain frequency estimation procedure can be used to estimate a raw frequency of an oscillation frequency, followed by oscillation magnitude and phase estimation 225. Oscillation magnitude and phase estimation 225 can be carried out by using an adaptive window length full cycle Fourier transform. The window length (e.g., amount of data to be operated on) in the Fourier transform may be adjusted based on the estimated oscillation frequency.

Oscillation damping ratio estimation 230 can then be carried out by processing the digital data samples. The processing, which can include using an algorithm to determine a damping coefficient, provides an indication of a nature of the damping characteristic (whether magnitude is increasing or decreasing with time).

It will be pertinent to point out that one or more of oscillation frequency estimation 220, oscillation magnitude and phase estimation 225, and/or oscillation damping ratio estimation 230, can be omitted or suitably modified when the digital data samples provided by the signal detector 210 correspond to the DC component or a very low frequency component in the predefined fifth frequency band.

Alarm and trip logic 235 can rapidly generate a remedial action, a protective operation, and/or a warning when a magnitude, a phase, and/or a damping coefficient exceeds preset thresholds. For example, a remedial action can be initiated as soon as oscillation frequency estimation 220 and oscillation magnitude and phase estimation 225 provide results within a range of or spanning from about 1.25 to about 1.75 oscillation cycles upon onset of the oscillation frequency, and/or when oscillation damping ratio estimation 230 provides results within a range of or spanning from about 2.5 to about 3.5 oscillation cycles upon onset of the oscillation frequency. The preset thresholds may be determined by various entities, such as an onsite operator, a technician, a designer, or a manufacturer of the oscillation monitoring system 150. One example of a preset threshold is a damping ratio that is set by one of the various entities.

Remedial action can include countering the oscillatory condition by modifying and/or stopping the operation of one or more elements that contribute to the oscillatory condition. For example, alarm and trip logic 235 can transmit a control signal via line 146 to protection equipment 113 in order to prevent switching system 117, for example, from injecting signals into the electrical power grid 110 that contribute to an oscillatory condition in the electrical power grid 110. The control signal may be used to operate a circuit breaker, a fuse, and/or a switch for example, to isolate switching system 117 from the electrical power grid 110. In another example, alarm and trip logic 235 can transmit an alarm signal via line 146 to a control facility or to a technician for taking remedial action.

FIG. 3 illustrates some exemplary elements that can be utilized for envelope extraction 214 in the signal detector 210 shown in FIG. 2. Envelope extraction 214 is particularly associated with the fourth predefined frequency band (about 10 Hz to about 45/55 Hz). The 45 Hz frequency is applicable when the nominal system frequency of electrical power transmitted over the electrical power grid 110 is about 50 Hz, and the 55 Hz is applicable when the nominal system frequency of electrical power transmitted over the electrical power grid 110 is about 60 Hz. In this exemplary embodiment, the digital data samples are provided by the ADC 140 (shown in FIG. 1) via the link 141 at a rate of 64 samples per cycle. In other embodiments, other sample rates can be used.

High-pass infinite impulse response (IIR) filter 305 operates upon the digital data samples (64 samples per cycle) to output a first filtered digital data stream "$y_H$" that is then operated upon by a low-pass finite impulse response (FIR) filter 310. The output of the low-pass FIR filer 310 is a second filtered digital data stream "$y_L$" that is coupled into an orthogonal filter pair (FIR filter 315 and FIR filter 325). FIR filter 315 operates upon a quadrature component "hs" of the second filtered digital data stream "$y_L$" and outputs a filtered digital data stream "ys." FIR filter 325 operates upon a real component "hc" of the second filtered digital data stream "$y_L$" and outputs a filtered digital data stream "yc." Each of the digital data stream "ys" and the digital data stream "yc" is at an exemplary data rate of 64 samples per cycle.

Decimation 320 changes the digital data stream "ys" to a digital data stream "xs" by decimating the exemplary data rate of 64 samples per cycle to a lower data rate such as 8 samples per cycle. Similarly, decimation 330 changes the digital data stream "yc" to a digital data stream "xc" by decimating the exemplary data rate of 64 samples per cycle to a lower data rate such as 8 samples per cycle. Envelope extraction 335 is then carried out upon each of the digital data stream "xs" and the digital data stream "xc."

Envelope extraction 335 includes applying Equation 1 (shown below) to each digital sample in each of the digital data stream "xs" and the digital data stream "xc" for obtaining output signal "x(n)."

$$x(n) = \sqrt{\frac{x_c(n) \cdot x_c(n) + x_s(n) \cdot x_s(n)}{2}}$$ Equation 1

The output of envelope extraction 335 is filtered by a high-pass IIR filter 340 and a low-pass FIR filter 345. High-pass IIR filter 340 incorporates Equation 2 (shown below) and low-pass FIR filter 345 incorporates Equation 3 (shown below) where "a" and "b" are filter coefficient arrays, "LB" and "LA" are filter lengths of the arrays, "x" is the input signal (i.e., "x(n)" in FIG. 3), and "y" is the output signal (i.e., "y(n)") in FIG. 3).

$$y(n) = \sum_{i=0}^{LB-1} b(i) \cdot x(n-i) - \sum_{i=1}^{LA-1} a(i) \cdot y(n-i)$$ Equation 2

$$y(n) = \sum_{i=0}^{LB-1} b(i) \cdot x(n-i)$$ Equation 3

The output signal "y(n)" is propagated for validation 215 via link 216 (shown in FIG. 2). As indicated above, envelope extraction 214 is particularly associated with the fourth predefined frequency band. Furthermore, certain operations carried out in oscillation magnitude and phase estimation 225 (shown in FIG. 2) are also particularly associated with the fourth predefined frequency band. Equations 4 through 7 (shown below) can be used to execute oscillation magnitude and phase estimation 225 where "N" is the number of digital data samples in a cycle, "FS" is the sample rate, "freq" is a current value of a calculated frequency in Hz, "OFFSET" is based on a fraction for calculating an offset in a number of digital data samples, "fraction" is an offset in fraction of a full cycle, u(n) is an oscillation signal, t(n) is a timestamp corresponding to the oscillation signal, and "n" is the present sample index.

$$N = \text{floor}\left(\frac{FS}{freq}\right)$$ Equation 4

$$\text{fraction} = t(n) \cdot freq - \text{fix}(t(n) \cdot freq)$$ Equation 5

$$\text{OFFSET} = \text{fraction} \cdot N + 1 + \frac{\left(\frac{FS}{freq} - N\right)}{2}$$ Equation 6

$$\text{Phasor}(n) = \frac{2}{N} \cdot \sum_{k=0}^{N-1} u(n+k-N+1) \cdot e^{-i2\pi \frac{k+OFFSET}{N}}$$ Equation 7

Oscillation damping ratio estimation 230 (shown in FIG. 2) can be carried out upon any one of the first predefined frequency band, the second predefined frequency band, the third predefined frequency band, or the fourth predefined frequency band. Equation 8 (shown below) can be used to define a sinusoidal oscillation signal with magnitude modulation where "A" is the magnitude of the sinusoidal signal, "f1" is the system frequency, "$\omega_m$" is the angular frequency of the modulating signal (this is the oscillation frequency that was estimated in oscillation frequency estimation 220), "m" is the magnitude of the modulating signal (in fraction of magnitude A, note that is the oscillation magnitude that was obtained in oscillation magnitude and phase estimation 225), σ is the exponential growth (or decay) rate of the modulating signal, u(t) is the step function, i.e. when t>$t_0$, the oscillation starts.

$$y(t) = \sqrt{2}A(1+m \cdot e^{\sigma(t-t_0)} \cdot \sin(\omega_m(t-t_0)) \cdot u(t_0)) \cdot \sin(2\pi f_1 t)$$ Equation 8

The damping ratio of the oscillation signal can be defined by Equation 9 shown below, wherein when σ is a negative number, the damping ratio is positive which means that the oscillation is damped, i.e. the oscillation magnitude will get smaller and smaller with time; and when σ is a positive number, the damping ratio is negative which means that the oscillation is un-damped, i.e. the oscillation magnitude will get larger and larger with time.

$$\xi = \frac{-\sigma}{\sqrt{\sigma^2 + \omega_m^2}}$$ Equation 9

The damping ratio can be estimated using Equation 10 and Equation 11 shown below, where $(t_1, y_1)$ and $(t_2, y_2)$ are the coordinates of two points on an exponential growth curve (or an exponential delay curve), z is a middle variable, and ξ is the calculated damping ratio. Equation 11 can be expressed as a percentage if so desired.

$$z = \frac{\ln\left(\frac{y_1}{y_2}\right)}{\omega_m(t_2 - t_1)}$$ Equation 10

$$\xi = \sqrt{\frac{z^2}{z^2 + 1}}$$ Equation 11

The various operations described above with respect to the various figures can be carried out in real time or near-real time in contrast to traditional solutions wherein data processing is carried out after undergoing delays associated with activities such as data collection (waiting to gather sufficient amount of data) and data transport (for example using various types of storage media).

Furthermore, in some exemplary implementations, the digital data samples that are operated upon by the oscillation monitoring system 150 can be time stamped (with an absolute time reference, for example). When time-stamped, oscillation magnitude and phase estimation 225 and oscillation damping ratio estimation 230 provide synchrophasor information of one or more oscillation frequencies in a predefined frequency band, such as the fourth predefined frequency band or the fifth predefined frequency band. This synchrophasor information can be used for comparison purposes between two geographically separated locations having the same oscillation frequency. Thus, synchrophasor phase angle information obtained at a first location can be compared against synchrophasor phase angle information obtained at a second location. The synchrophasor information obtained in accordance with some embodiments of the disclosure may have certain tolerances that can occur when compensation is not carried out for phase shifts and delays caused by various filters. In such cases, the synchrophasor information may be interpreted as quasi synchrophasor information and referred to as SynchroOscPhasor in accordance with the disclosure.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A system comprising:
an oscillation detector configured to:
receive digital data indicative of amplitude fluctuations in electricity transmitted through an electrical power grid;
process the digital data for detecting an oscillatory condition in at least one of five predefined frequency bands, wherein the oscillatory condition for a first of the five predefined frequency bands is associated with a governor or automatic generation control condition, the oscillatory condition for a second of the five predefined frequency bands is associated with an inter-area oscillation, the oscillatory condition for a third of the five predefined frequency bands is associated with a forced oscillation originated by an operational interaction between two or more components coupled to the electrical power grid, the oscillatory condition for a fourth of the five predefined frequency bands is associated with a sub-synchronous resonance condition or a sub-synchronous torsional interaction between two components coupled to the electrical power grid, and the oscillatory condition for a fifth of the five predefined frequency bands is associated with geomagnetically induced currents present in a first component that is a part of the electrical power grid;
upon detecting the oscillatory condition, determine at least one of a magnitude characteristic, a phase characteristic, or a damping characteristic of at least one oscillation frequency that contributes to the oscillatory condition; and
based at least in part on the at least one of magnitude characteristic, phase characteristic, or damping characteristic, generate a remedial action or protective operation, when a predefined threshold is exceeded for the least one of magnitude characteristic, phase characteristic, or damping characteristic,
wherein the five predefined frequency bands include a first frequency band spanning from about 0.01 Hz to about 0.1 Hz, a second frequency band spanning from about 0.1 Hz to about 1 Hz, a third frequency band spanning from an oscillation frequency greater than about 1 Hz to about 10.0 Hz, a fourth frequency band spanning from about 10 Hz to about 55 Hz, and a fifth frequency band comprising a DC component.

2. The system of claim 1, wherein the at least one oscillation frequency is within the first frequency band and is originated by at least one of the governor or the automatic generation control condition in a second component that is a part of the electrical power grid.

3. The system of claim 1, wherein the at least one oscillation frequency is within the second frequency band and is indicative of the inter-area oscillation.

4. The system of claim 1, wherein the at least one oscillation frequency is within the third frequency band and is indicative of the forced oscillation originated by the operational interaction between the two or more components coupled to the electrical power grid.

5. The system of claim 4, wherein at least one of the two or more components is a device that uses a switching-mode of operation and wherein the oscillation detector is further configured to compare a magnitude of the forced oscillation against a reference threshold.

6. The system of claim 1, wherein the at least one oscillation frequency is within the fourth frequency band and is indicative of at least one of the sub-synchronous resonance condition or the sub-synchronous torsional interaction between the two components coupled to the electrical power grid.

7. The system of claim 1, wherein the at least one oscillation frequency is within the fifth frequency band and is indicative of the geomagnetically induced currents present in the first component.

8. The system of claim 1, further comprising:
one or more sensors coupled to at least one component that is a part of the electrical power grid; and
an analog-to-digital converter configured to receive sensor data from the one or more sensors and to convert the sensor data into the digital data indicative of amplitude fluctuations in electricity transmitted through the electrical power grid.

9. A method comprising:
receiving digital data indicative of amplitude fluctuations in electricity transmitted through an electrical power grid;
processing the digital data for detecting an oscillatory condition in at least one of five predefined frequency bands, wherein the oscillatory condition for a first of the five predefined frequency bands is associated with a governor or automatic generation control condition, the oscillatory condition for a second of the five predefined frequency bands is associated with an inter-area oscillation, the oscillatory condition for a third of the five predefined frequency bands is associated with a forced oscillation originated by an operational interaction between two or more components coupled to the electrical power grid, the oscillatory condition for a fourth of the five predefined frequency bands is associated with a sub-synchronous resonance condition or a sub-synchronous torsional interaction between two components coupled to the electrical power grid, and the oscillatory condition for a fifth of the five predefined frequency bands is associated with geomagnetically induced currents present in a first component that is a part of the electrical power grid;
upon detecting the oscillatory condition, determining at least one of a magnitude characteristic, a phase characteristic, or a damping characteristic of at least one oscillation frequency that contributes to the oscillatory condition; and
based at least in part on the at least one of magnitude characteristic, phase characteristic, or damping characteristic, generate a remedial action or protective operation, when a predefined threshold is exceeded for the least one of magnitude characteristic, phase characteristic, or damping characteristic,
wherein the five predefined frequency bands include a first frequency band spanning from about 0.01 Hz to about 0.1 Hz, a second frequency band spanning from about 0.1 Hz to about 1 Hz, a third frequency band spanning from an oscillation frequency greater than about 1 Hz to about 10.0 Hz, a fourth frequency band spanning from about 10 Hz to about 55 Hz, and a fifth frequency band comprising a DC component.

10. The method of claim 9, wherein processing the digital data for detecting the oscillatory condition comprises:
executing an envelope extraction procedure upon the digital data for detecting the oscillatory condition in the fourth frequency band of the five predefined frequency bands.

11. The method of claim 10, wherein executing the envelope extraction procedure comprises one or more filtering operations to eliminate frequency components that are outside the fourth frequency band.

12. A method comprising:
obtaining, in real-time, sensor data indicative of amplitude fluctuations in electricity transmitted through an electrical power grid;
converting, in real-time, the sensor data into digital data samples;
processing the digital data samples or detecting an oscillatory condition in at least one of five predefined frequency bands, wherein the oscillatory condition for a first of the five predefined frequency bands is associated with a governor or automatic generation control condition, the oscillatory condition for a second of the five predefined frequency bands is associated with an inter-area oscillation, the oscillatory condition for a third of the five predefined frequency bands is associated with a forced oscillation originated by an operational interaction between two or more components coupled to the electrical power grid, the oscillatory condition for a fourth of the five predefined frequency bands is associated with a sub-synchronous resonance condition or a sub-synchronous torsional interaction between two components coupled to the electrical power grid, and the oscillatory condition for a fifth of the five predefined frequency bands is associated with geomagnetically induced currents present in a first component that is a part of the electrical power grid;
upon detecting the oscillatory condition, determining at least one of a magnitude characteristic, a phase characteristic, or a damping characteristic of at least one oscillation frequency that contributes to the oscillatory condition; and
based at least in part on the at least one of magnitude characteristic, phase characteristic, or damping characteristic, generate a remedial action or protective operation, when a predefined threshold is exceeded for the least one of magnitude characteristic, phase characteristic, or damping characteristic,
wherein the five predefined frequency bands include a first frequency band spanning from about 0.01 Hz to about 0.1 Hz, a second frequency band spanning from about 0.1 Hz to about 1 Hz, a third frequency band spanning from an oscillation frequency greater than about 1 Hz to about 10.0 Hz, a fourth frequency band spanning from about 10 Hz to about 55 Hz, and a fifth frequency band comprising a DC component.

13. The method of claim 12, wherein processing the digital data samples for detecting the oscillatory condition comprises:
executing an envelope extraction procedure upon the digital data samples for detecting the oscillatory condition in the fourth frequency band of the five predefined frequency bands.

14. The method of claim 12, further comprising:
applying a time-stamp to the sensor data; and
using the time-stamped sensor data to determine synchrophasor information of the at least one oscillation frequency in the at least one of five predefined frequency bands.

15. The method of claim 14, wherein the synchrophasor information comprises synchrophasor angle information of the at least one oscillation frequency.

* * * * *